Oct. 5, 1965 H. A. ULLMAN 3,210,561

COMPOUND TRANSISTOR CIRCUITS

Filed May 3, 1961

INVENTOR.
HERBERT A. ULLMAN

BY F. L. Sullivan
ATTORNEY 3,210,561
COMPOUND TRANSISTOR CIRCUITS
Herbert A. Ullman, Burlington, Mass., assignor to Sylvania Electric Products Inc., a corporation of Delaware
Filed May 3, 1961, Ser. No. 107,554
3 Claims. (Cl. 307—88.5)

This invention is concerned with compound transistor circuits, and more particularly with a specific design of such circuits, which afford less power dissipation without the sacrifice of any of the inherent advantages of such circuits.

A typical compound transistor circuit, frequently used in the electronic industry, is the so-called Darlington compound circuit. This type of circuit shown in FIG. 1 affords high gain using minimum delay time. The circuit is operated by providing an input pulse to the input transistor causing an emitter current which operates to turn the output transistor on, which in turn completes a current circuit to a load. Usually the power gain factor in the output transistor is close to that of the input transistor, so that when input current is amplified by a factor $\beta$, for example, it is further magnified by the same factor, $\beta$, in the output transistor, if we assume linearity in the circuit. Therefore, the load current would be the input current magnified by a factor $\beta+\beta^2$. If we further assume that the emitter voltage of the input transistor is a reference, it may be seen that the collector voltage of the input transistor is negative and therefore the collector-to-base voltage of the output transistor will be back-biased by the amount of voltage, collector-to-emitter, in the input transistor; and the voltage, collector-to-emitter, of the output transistor will surpass the minimum allowable voltage for this output transistor to be in saturation. Power dissipation of the output transistor being at a minimum depends upon this output transistor being as close to saturation as possible, or in saturation.

Accordingly, a primary object of this invention is to provide a compound transistor circuit with lower power dissipation in the output transistor. A further object is to provide forward biasing of the collector junction of the output transistor of a compound transistor circuit, so that the output transistor operates as close to the saturation region as possible. Other objects are to provide a more efficient compound transistor circuit.

These and related objects are accomplished in one illustrative embodiment of the invention which features a compound transistor circuit having high gain and small delay time and yet a low power dissipation in the output transistor, by providing a resistor in the collector circuit of the output transistor.

Figure 1:
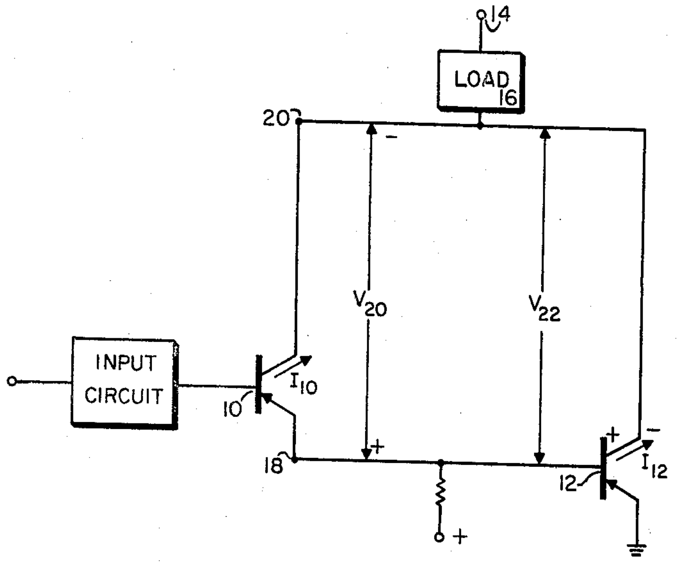
FIG. 1 PRIOR ART
Figure 2:
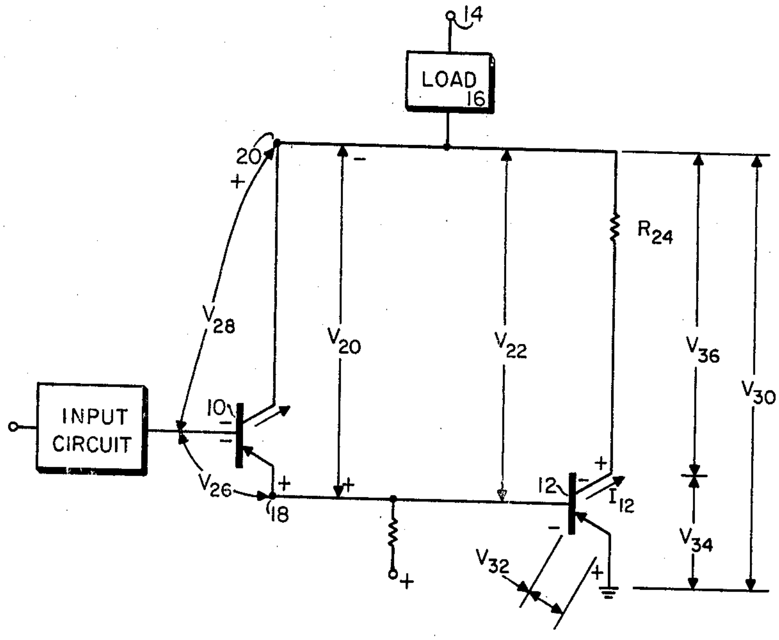

This embodiment of the invention will be explained in more detail, and other features and modifications of the invention will be apparent from the following explanation and reference to the accompanying drawings, wherein:

FIG. 1 is a schematic representation of a Darlington compound transistor circuit; and FIG. 2 is a schematic representation of a Darlington compound circuit with a resistor, according to the invention, added in the collector circuit of the output transistor.

Those skilled in the electronics art are familiar with the identification of specific transistor characteristics by what is known as device (i.e. transistor) $\beta$. It is also well known that net current gain in a specific transistorized circuit is referred to as circuit $\beta$ or gain. Referring to FIG. 1 and assuming the piecewise linearity of the circuit shown, we may also assume that the circuit $\beta$ of transistor 10 is approximately equal to $\beta$ as determined by the power supply 14 and the load 16; and the circuit $\beta$ of transistor 12 would therefore also be approximately equal to $\beta$, since we are also assuming transistor 10 is operating close to the saturation region. When we provide an input current pulse to transistor 10 and especially to its base circuit, transistor 12 will be turned on and provide a load current equal to the sum of the currents in transistors 10 and 12, $I_{10}$ and $I_{12}$. In this case by definition the load current is approximately equal to the input current times $\beta+\beta^2$, with the components of this result being the input current times $\beta$ plus the input current times $\beta^2$, if the collector and emitter currents of both transistors 10 and 12 are approximately equal. Taking the voltage at point 18 with reference to ground as a reference, the voltage $V_{20}$ at point 20 will be negative. Therefore, the collector-to-base voltage 22 of output transistor 12 will be back-biased by the collector-to-emitter voltage at point 20, so that transistor 12 will not approach the saturation region of operation, since the voltage at point 20 is above the minimum required for transistor 12 to be in the saturation region. Voltage at point 20 is fixed so that some means must be provided to forward bias the collector-to-base junction voltage 22 of transistor 12, which collector-to-base junction is easiest to view as a diode, and in turn allow transistor 12 to operate in the saturation region.

Referring to FIG. 2, a resistor 24 is added to the collector circuit of output transistor 12, resulting in the following circuit specification:

For the input transistor 10, (*a*) $V_{20}=V_{26}-V_{28}=$ a small negative voltage with polarities as shown (*b*) $V_{30}=V_{32}+V_{20}$ (*c*) $V_{34}=V_{30}-V_{36}$ (*d*) $V_{36}=I_{12}\times R_{24}$ (*e*) $V_{34}=(V_{32}+V_{20})-I_{12}\times R_{24}$ In Equation *e*, $(V_{32}+V_{20})$ is fixed by the transistor characteristics, so that to allow $V_{34}$ to be small enough for transistor 12 to operate in the saturation region thereby reducing power dissipation (which is a function of voltage and current), the resistor 24 must be increased with the limit of increase being reduced when $$R_{24}\times I_{12}=(V_{32}+V_{20})$$

A means for obtaining saturation of transistor 12 has, therefore, been provided by the addition of a suitable resistor 24. Consequently, circuit $\beta$ of transistor 12 has also been decreased since the collector-to-emitter voltage 34 of transistor 12 has been decreased, allowing transistor 12 to operate in the saturation region. It follows that the current $I_{12}$ through transistor 12 has also been decreased, thereby reducing the product of collector-to-emitter voltage 34 of transistor 12 and the transistor 12 collector current $I_{12}$, which in turn causes power dissipation from transistor 12 to be greatly reduced.

The addition of resistor 24 has not in any way impaired the inherent transient gain of the compound transistor circuit, and yet by reducing the two most important components of the power dissipation of transistor 12, $V_{34}$ and $I_{12}$, transistor 12 will be less limited in terms of choice of a transistor with high power capabilities. Furthermore, a transistor of moderate power capabilities in today's state of technology will be a faster transistor and much less expensive. The circuit also maintains its ability to provide less turn-on delay and rise time.

The invention is not limited to the specific examples, features and combinations shown and described, but is to be accorded the full scope of the following claims.

What is claimed is:

1. A compound transistor circuit wherein both transistors share the load and the output transistor operates in saturation, said circuit comprising, first and second transistors each having base, emitter and collector electrodes, a positive and negative source of energizing potential, a direct connection between the emitter of said first transistor and the base of said second transistor, means directly connecting the emitter of said second transistor to ground, means for applying a signal to the base of said first transistor, a first resistor connected between said direct connection and said positive source of potential, a load connected between said negative source of potential and the collector of said first transistor, and a second resistor connected between respective collectors of said first and second transistors and operative to forward bias the collector-base junction of said second transistor to cause said second transistor to operate in saturation or as close to saturation as possible and thereby reduce power dissipation therein.

2. A compound transistor circuit comprising, first and second sources of energizing potential, a load, first and second transistors, each having base, emitter and collector electrodes, first and second resistors, means for applying a signal to the base electrode of said first transistor, means for directly connecting the emitter electrode of said first transistor to the base electrode of said second transistor, means for connecting the emitter electrode of said second transistor to a point of ground potential, means for connecting said load between the collector electrode of said first transistor and said first source of energizing potential, means for connecting said first resistor between the emitter electrode of said first transistor and said second source of energizing potential, and means for connecting said second resistor between the collector electrode of said second transistor and the collector electrode of said first transistor.

3. In a Darlington compound circuit which includes first and second transistors arranged in load sharing relationship and each having base, emitter and collector electrodes, a direct current power source, a direct connection from the emitter of said first transistor to the base of said second transistor, means for applying a signal to the base of said first transistor, and a load connected between the collector of said first transistor and said power source, a resistor connected between the collector of said second transistor and the collector of said first transistor and operative to forward bias the collector-base junction of said second transistor to cause said second transistor to operate in saturation and thereby reduce power dissipation in said second transistor.

References Cited by the Examiner

UNITED STATES PATENTS

| | | | |
|---|---|---|---|
| 2,663,806 | 12/53 | Darlington | 307—88.5 |
| 2,844,667 | 7/58 | Yaeger | 330—20 X |
| 2,887,542 | 5/59 | Blair et al. | 330—20 X |
| 2,968,748 | 1/61 | Davenport | 317—148.5 |

OTHER REFERENCES

Hurley: "Junction Transistor Electronics," 1958, John Wiley, pages 100–101.

JOHN W. HUCKERT, *Primary Examiner.*

HERMAN K. SAALBACH, *Examiner.*